United States Patent
Lajza, Jr. et al.

(10) Patent No.: US 6,306,331 B1
(45) Date of Patent: Oct. 23, 2001

(54) ULTRA MOLD FOR ENCAPSULATING VERY THIN PACKAGES

(75) Inventors: John J. Lajza, Jr.; Charles R. Ramsey, both of Essex Junction; Robert M. Smith, Jericho, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/275,169

(22) Filed: Mar. 24, 1999

(51) Int. Cl.[7] .......................... B29C 70/70; B29C 45/02; B29C 33/10; B29C 33/24
(52) U.S. Cl. .................. 264/272.13; 264/271.1; 264/272.15; 264/272.17
(58) Field of Search .................... 425/116, 812, 425/410, 411, 544; 264/272.11, 271.1, 272.13, 272.15, 272.17, 319, 328.7

(56) References Cited

U.S. PATENT DOCUMENTS

| | | | |
|---|---|---|---|
| 3,505,446 | * 4/1970 | Griffith | 264/271.1 |
| 3,991,146 | 11/1976 | Barrie | 264/46.7 |
| 4,184,835 | * 1/1980 | Talbot | 425/577 |
| 4,464,322 | * 8/1984 | Butler | 264/138 |
| 4,470,786 | * 9/1984 | Sano et al. | 425/125 |
| 4,618,466 | * 10/1986 | McGlashen et al. | 264/328.7 |
| 4,770,833 | * 9/1988 | Hughes | 264/120 |
| 4,954,308 | 9/1990 | Yabe et al. | 264/272.17 |
| 5,049,344 | * 9/1991 | Sorenson | 264/255 |
| 5,049,526 | * 9/1991 | McShane et al. | 264/272.14 |
| 5,110,515 | 5/1992 | Nakamura et al. | 264/25 |
| 5,174,941 | * 12/1992 | Sorensen | 264/328.7 |
| 5,326,243 | * 7/1994 | Fierkens | 425/116 |
| 5,344,600 | * 9/1994 | McShane et al. | 264/272.17 |
| 5,366,368 | 11/1994 | Jang | 425/544 |
| 5,429,488 | * 7/1995 | Neu | 425/116 |
| 5,451,153 | 9/1995 | Eriksen et al. | 425/116 |
| 5,480,296 | 1/1996 | Jang | 425/116 |
| 5,523,038 | 6/1996 | Kunieda et al. | 264/135 |
| 5,558,883 | 9/1996 | Shinada et al. | 425/116 |
| 5,609,889 | 3/1997 | Weber | 425/116 |
| 5,626,886 | 5/1997 | Ishii | 425/116 |
| 5,650,177 | 7/1997 | Kojima et ql. | 425/116 |
| 5,714,106 | * 2/1998 | Yoda et al. | 264/275 |
| 5,800,763 | * 9/1998 | Hoppe et al. | 264/255 |
| 5,846,470 | * 12/1998 | Funatsu et al. | 264/275 |
| 5,955,115 | * 9/1999 | Bolanos et al. | 425/116 |
| 5,965,078 | * 10/1999 | Bolanos et al. | 264/272.17 |
| 5,985,185 | * 11/1999 | Steijer et al. | 425/116 |
| 6,080,354 | * 6/2000 | Miyajima | 264/511 |

* cited by examiner

*Primary Examiner*—Angela Ortiz
(74) *Attorney, Agent, or Firm*—DeLio & Peterson, LLC; Peter W. Peterson; James M. Leas (57) ABSTRACT

A method of encapsulating a workpiece, particularly a microelectronic device, to achieve a very thin encapsulating layer and reduce the finished device size. The method includes positioning the workpiece in the mold cavity of a mold capable of reducing its volume while the mold compound is in a liquid state from a first volume, where mold compound may be easily added without creating voids, to a second smaller volume which defines the finished workpiece size. The second volume is below the size which would permit the void-free encapsulation of the workpiece in a conventional thermosetting plastic transfer molding machine. The mold may be opened in two stages to prevent damage to thin molded microelectronic devices by opening the perimeter of the mold first while the molded device is still being supported by large molding surfaces. The invention also includes the mold used in the method.

19 Claims, 6 Drawing Sheets

ULTRA MOLD FOR ENCAPSULATING VERY THIN PACKAGES

BACKGROUND OF THE INVENTION

1. Field of the Invention

The present invention relates to the encapsulation of thin workpieces, particularly electronic and microelectronic devices, to achieve a very thin, but void-free seal around the workpiece.

2. Description of Related Art

Microelectronic devices must be protected against moisture as well as assembly process and other environmental contaminants. This is commonly done by encapsulating the device in a mold compound, such as a thermosetting plastic, applied by a transfer molding process.

In a typical transfer molding machine used in the microelectronics industry, a thin electronic workpiece mounted on a lead frame is clamped between two halves of a split mold. The mold defines a mold cavity around the device with sufficient clearance to allow mold compound to be injected and flow around the device to encapsulate it. During the molding process mold compound is injected into an inlet and air inside the mold escapes from a vent.

The mold compound is initially provided in a non-liquid pellet form containing a desired quantity of the compound. The pellet is heated under pressure in a chamber until it is liquefied. A plunger then drives the liquefied mold compound into the mold cavity. The mold compound is allowed to cure and the mold is opened, releasing the encapsulated microelectronic device.

Because smaller microelectronic devices are highly desirable, device manufacturers would like to reduce the thickness of the encapsulating layer of mold compound which encases each device. Thinner encapsulating layers also aid in improving device performance or reliability with regard to heat dissipation, resistance to coating damage under thermal stress and other parameters. However, as the distance between the inner mold surfaces and the electronic workpiece is decreased, it becomes more difficult to obtain a high quality void-free encapsulant around the entire device.

To obtain a void-free seal, the liquefied mold compound must enter the mold inlet and entirely fill the space in the mold cavity before the mold compound flow front arrives at the mold vent. If the mold compound reaches the vent before the mold is completely filled, an air bubble is trapped in the mold, creating a void.

To completely fill the mold cavity, the mold compound must flow between the upper mold surface and the upper surface of the device, between the lower mold surface and the lower surface of the device, and into the space surrounding the outer perimeter of the device. However, as the distance between the upper and lower mold surfaces and the device is reduced, so as to make the encapsulating coating thinner, it becomes more difficult for the mold compound to penetrate these regions.

If this distance is reduced too far, the mold compound will flow around the outer perimeter of the device before the mold compound flow front has displaced the air in the space above and below the device. The result is a void in the encapsulation material as an air bubble is pinched off in the center of the device.

As a result, transfer molding of semiconductor devices with conventional equipment has required that the distance from the inner mold surfaces to the device be at least about 200–250 micrometers. This ensures that there will be laminar flow of the molding compound into the mold and around the device. The exact minimum distance limit is, of course, a function of the specific mold compound used, the fillers it contains and process parameters, such as temperature, but, in general, reducing the distance from the inner mold surfaces to the device to less than some minimum distance results in unacceptable manufacturing losses due to the formation of voids.

Provided that sufficient clearance between the inner mold surfaces and the device is maintained, however, the flow of the mold compound during injection remains laminar, and the flow fronts above and below the device remain relatively balanced, so as to prevent the formation of voids. On the other hand, it is known that acceptable sealing of the device and protection against environmental contamination can be achieved with an encapsulation thickness that is well below this thickness limit.

SUMMARY OF THE INVENTION

Bearing in mind the problems and deficiencies of the prior art, it is therefore an object of the present invention to provide a method of encapsulating an electronic workpiece with an outer coating of mold compound which is thinner than the thickness limit heretofore achievable with conventional transfer molding.

A further object of the invention is to provide a method of encapsulating an electronic workpiece with a coating of mold compound that is void-free.

It is yet another object of the present invention to provide a method of encapsulating an electronic workpiece by varying the mold dimensions while the mold compound is in a liquid state.

Yet another object of the present invention is to provide a mold for encapsulating an electronic workpiece that can vary in volume from a first volume where mold compound can be injected easily and completely surround the device with a relatively thick coating to a second reduced volume in which only a thin encapsulating coating remains.

Still other objects and advantages of the invention will in part be obvious and will in part be apparent from the specification.

The above and other objects and advantages, which will be apparent to one of skill in the art, are achieved in the present invention which is directed to a method of encapsulating an electronic workpiece and to a mold for use in the method. In the most basic form of the method of this invention, a mold cavity having a first volume has an electronic workpiece positioned therein. Mold compound is added to the mold cavity to encapsulate the microelectronic device, and the volume of the mold cavity is then reduced to a second volume less than the first volume. The mold compound is then cured and the device removed.

In the preferred method of the invention, the mold has a first volume with a size sufficiently large to permit laminar flow of the mold compound around substantially all sides of the electronic workpiece during the step of adding mold compound to the mold cavity. The second volume has a size less than the size necessary to permit such laminar flow. This allows the mold to produce very thin coatings of a thickness less than would otherwise be possible by conventional transfer molding techniques.

In the most highly preferred method of the invention, the mold cavity is adapted to receive a substantially planar electronic workpiece and includes a pair of opposed mold surfaces on opposite sides of the device. The volume of the mold cavity is reduced to the second volume by reducing the distance between the pair of opposed mold surfaces of the mold cavity.

The volume is reduced in one aspect of the method of this invention by providing a tapered clamp cavity defined between two opposed clamp plates having inclined ramp surfaces. The mold is held between the opposed clamp plates and is moved deeper into the tapered clamp cavity to reduce the distance between opposed mold surfaces of the mold cavity.

The mold compound used in connection with this method is typically a thermosetting plastic. In accordance with the method, the mold compound includes a filler. The filler is typically silica, but other fillers can be used to enhance thermal, electrical or mechanical properties of the mold compound.

The invention is particularly suitable for encapsulating microelectronic devices, but is also suitable for encapsulating other thin electronic workpieces, including printed circuits, various types of electronic components, microcircuits and the like.

The invention also includes the mold used in connection with the method described above. The mold includes a mold cavity having a volume defined by a plurality of mold surfaces, a first one of the mold surfaces being movable to reduce the volume of the mold cavity from a first volume to a smaller second volume. The mold cavity is openable to receive a microelectronic device, and an inlet communicates with the mold cavity for adding mold compound. The mold surfaces are sufficiently far from the electronic workpiece when the mold is in the first volume configuration to allow mold compound to be added to the mold cavity without forming voids.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–6 of the drawings in which like numerals refer to like features of the invention. Features of the invention are not necessarily shown to scale in the drawings.

Figure 1:
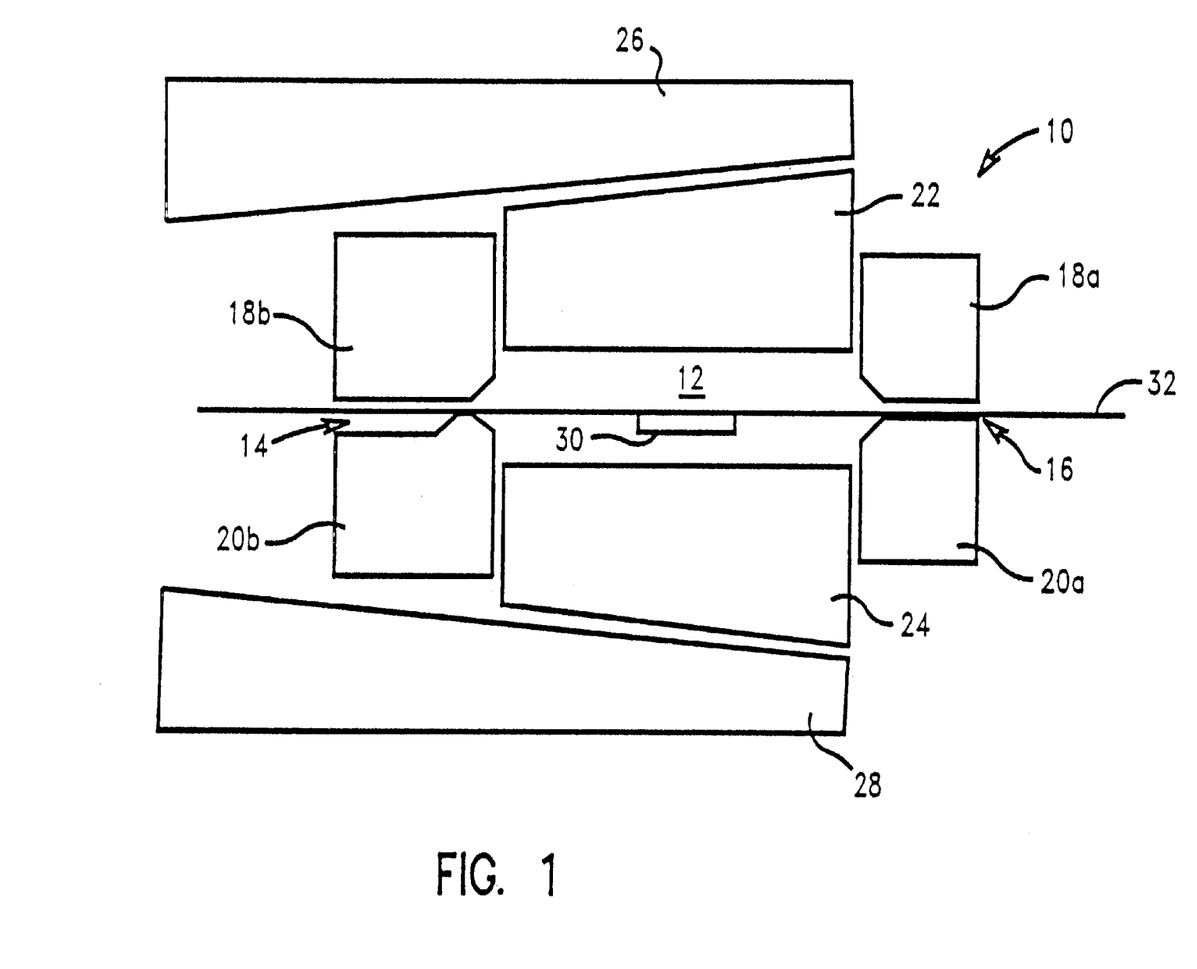
FIG. 1 is a side view, in cross-section, of a mold containing a microelectronic device and lead frame to be encapsulated in accordance with the method of this invention. The mold is shown in its large, first volume, configuration and is clamped and ready to be filled with mold compound.

FIG. 1 illustrates a preferred embodiment of a mold used in connection with the method of encapsulating an electronic workpiece described herein. The mold 10 includes a mold cavity 12 having an inlet 14 and a vent 16. The inner surfaces at the perimeter of the mold cavity are formed by upper clamp plate 18a, 18b and lower clamp plate 20a, 20b.

The clamp plate 18a, 18b defines a generally rectangular perimeter for the upper portion of the mold cavity. Upper movable cavity plate 22 sits within the rectangular opening in the upper clamp plate 18a, 18b, and it will be understood that in the cross sectional view of FIG. 1, the right side 18a and the left side 18b are the right and left portions of a single clamp plate appearing in cross section. The lower clamp plate 20a, 20b is similar, having a generally rectangular opening sealed by the lower movable cavity plate 24.

The upper and lower movable cavity plates 22, 24 define the upper and lower surfaces of the mold cavity 12 respectively. The mold 10, including the upper and lower movable cavity plates 22, 24, is mounted between upper and lower drive plates 26, 28. The upper and lower drive plates 26, 28 contact the upper and lower movable cavity plates 22, 24, and prevent them from moving outward during the molding operation as mold compound is introduced into the mold.

The upper and lower clamp plates can be separated to receive a microelectronic device 30 mounted on a lead frame 32. The clamp plates 18, 20 are clamped together in a conventional way with an external clamping mechanism that provides a vertical clamping force sufficient to hold the lead frame and to allow a mold compound, preferably a thermosetting resin, to be added to the mold cavity 12.

Inlet 14 is connected to a chamber in the transfer molding machine (not shown) which heats a pellet of thermosetting resin to liquefy it. The liquefied resin is injected under pressure into the mold shown in FIG. 1 through the inlet 14.

Figure 2:
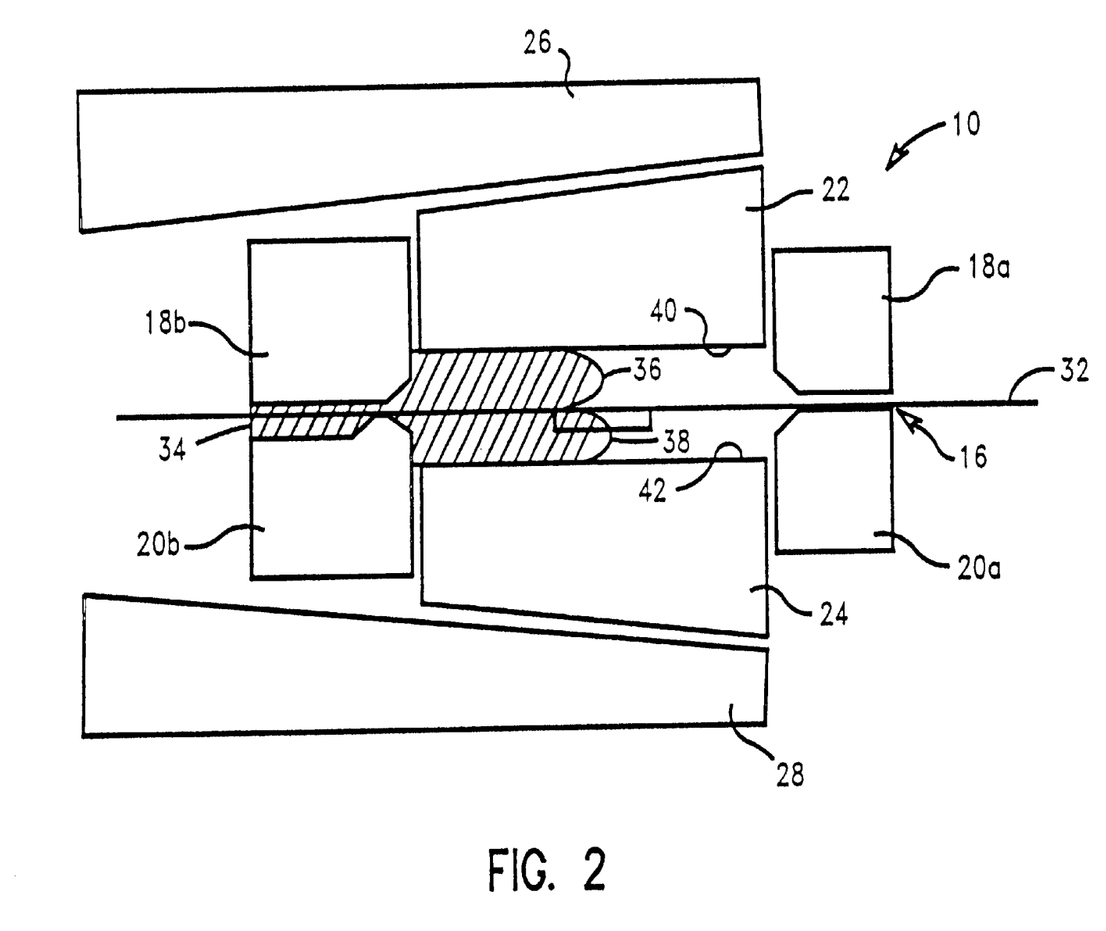
FIG. 2 is a side view, in cross-section, of the mold in FIG. 1, still in the first volume configuration, showing the mold at an intermediate time during the transfer molding operation. Mold compound is shown being transferred from an inlet at the left into the mold and balanced flow fronts above and below the device are depicted.

FIG. 2 shows the mold compound 34 flowing into the mold cavity 12 with two relatively uniform and equalized flow fronts 36, 38 on opposite sides of the microelectronic device 30. It will be noted in FIG. 2 that the flow fronts are curved and that the resin 34 in the boundary layer regions close to the device 30 and close to the upper and lower inner surfaces of the mold cavity 40, 42 lag behind the portion of the flow front which is at the maximum distance from these surfaces.

This curvature of the mold compound flow front is caused by the friction between the moving mold compound and the inner surfaces of the mold. The movable cavity plates 22, 24 are set such that void-free filling of the mold cavity can be reliably completed for each molding operation.

The movable cavity plates 22, 24 move relative to the microelectronic device 30 so as to increase or decrease the distance between their inner surfaces 40, 42 and the device 30. The distance is set to permit a laminar flow of the mold compound between the inner surfaces 40, 42 and the outer surfaces of the lead frame and microelectronic device 30. This insures that the mold compound 34 will substantially completely fill the interior of the mold cavity before the mold compound arrives at the vent 16 at the opposite end of the mold cavity.

For a conventional mold compound, this distance will be greater than 200 micrometers, preferably greater than 250 micrometers. As the mold compound 34 is added, the clamp plates 18, 20 are prevented from separating by conventional clamping means (not shown) and the movable cavity plates 22, 24 are prevented from opening further by the drive plates 26, 28.

Figure 3:
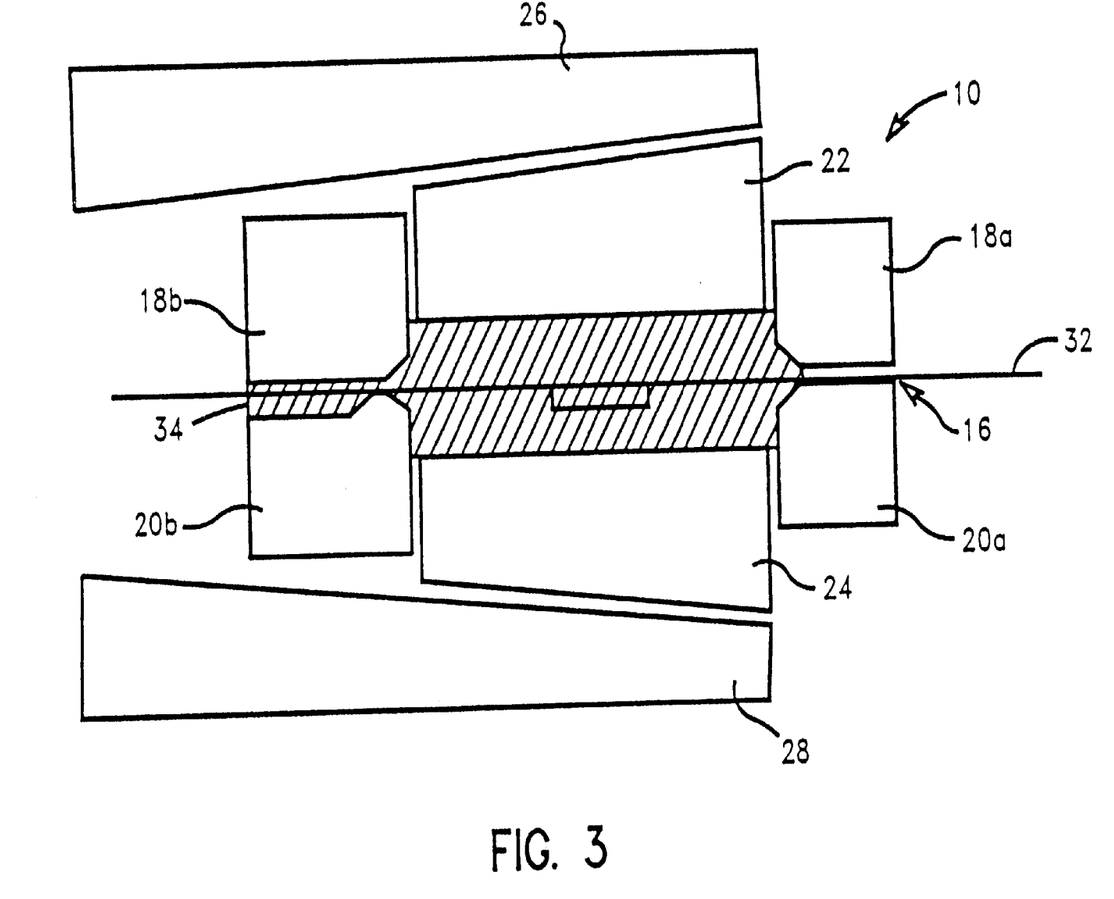
FIG. 3 is a side view, in cross-section, of the mold in FIG. 1, still in the first volume configuration, showing the mold completely filled, prior to reducing the volume of the mold to the second volume.

FIG. 3 shows the mold cavity 12 completely filled with the mold compound 34. At this stage of the molding operation, the mold compound is still in its liquid form. FIGS. 1, 2 and 3 all show the mold 10 with the mold cavity 12 in its largest volume position which is the first volume configuration used for filling the mold. This first volume configuration permits the mold compound 34 to easily flow into all areas of the mold, particularly the region directly above and below the center of the electronic workpiece 30.

Figure 4:
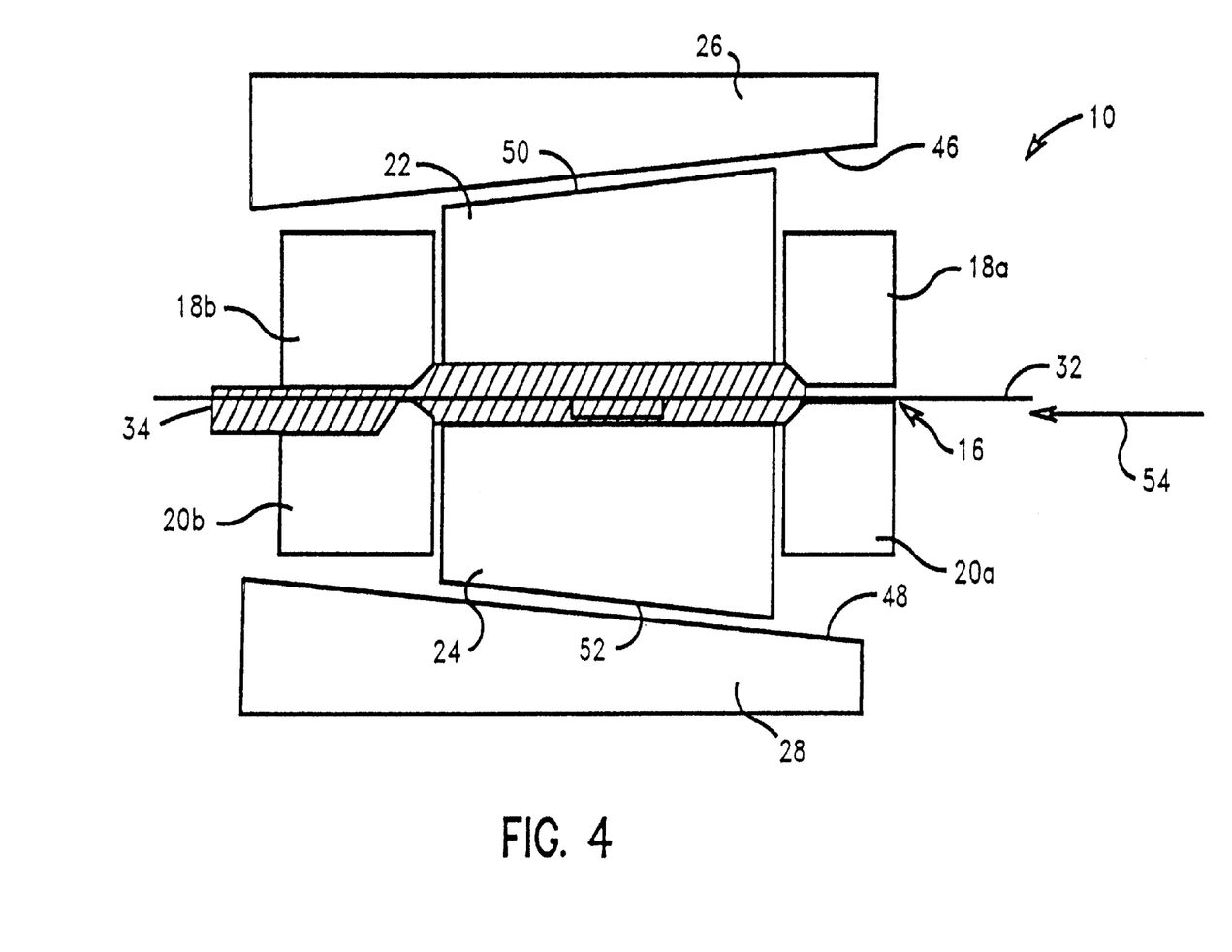
FIG. 4 is a side view, in cross-section, of the mold in FIG. 1, showing the mold in the reduced, second volume configuration.

FIG. 4 shows the mold in the reduced or second volume configuration. In this configuration, the upper and lower movable cavity plates 22, 24, have been driven towards the device 30 by the relative motion between the upper and lower drive plates 26, 28 and the mold.

The upper drive plate 26 includes an inclined ramp surface 46. The lower drive plate 28 also includes an inclined ramp surface 48, which faces the ramp surface 46. The upper and lower movable cavity plates have matching angled surfaces 50, 52 which slide on the ramp surfaces 46, 48.

As the drive plates move to the right and the clamp plates move to relative to the drive plates in the direction shown by arrow 54, the movable cavity plates are compressed toward each other by the action of the ramp surfaces 46, 48. This reduces the distance from the inner surfaces 40, 42 to the device 30 and decreases the volume of the mold cavity. As the volume of the mold cavity is reduced, mold compound is squeezed out of the mold cavity. The excess mold material is preferably squeezed back into the mold inlet 14, however the mold may also be provided with alternative outlets for the excess material, or the vent 16 may be used.

With the mold in the first volume configuration of FIGS. 1–3, the mold cavity is filled easily and completely as the mold compound enters the mold and spreads in laminar flow. After the mold is filled, the volume is reduced to the second volume configuration of FIG. 4. This second volume configuration is below the volume which allows such laminar flow.

The control over the volume of the mold allows different mold compounds to be used. Specifically, fillers may be added to the mold compound having desirable properties, but which might otherwise increase viscosity or not be capable of use in a conventional transfer molding machine.

Alternatively, additives that are presently in use solely to improve the thermosetting resin molding properties, but which otherwise have little value in the cured mold compound, may be eliminated due to the ease with which the mold of this invention may be filled.

Figure 5:
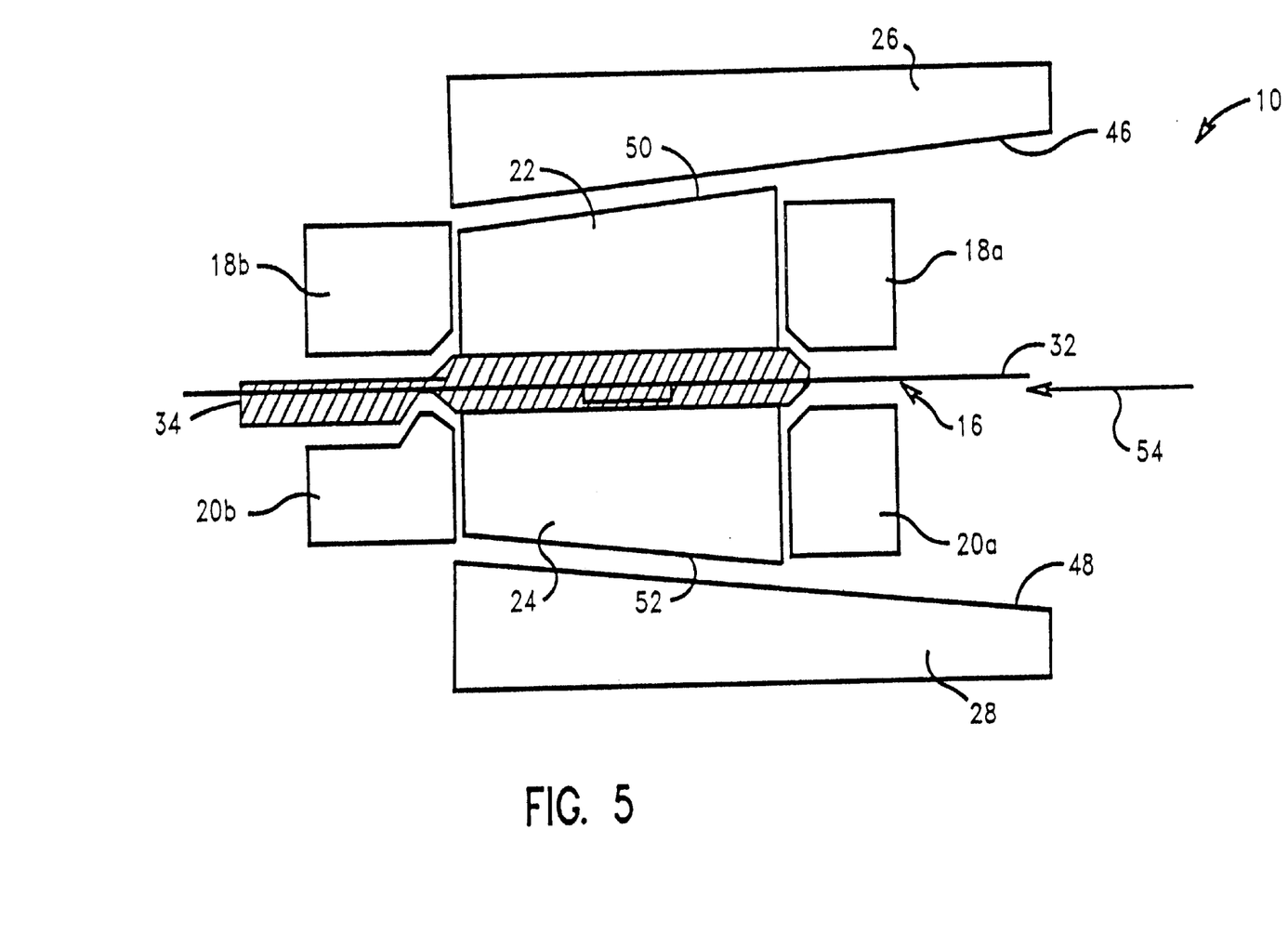
FIG. 5 is a side view, in cross-section, of the mold in FIG. 1, showing the mold being opened to release the device.

FIG. 5 shows the mold as it is being opened to remove the molded device 30. At this point in the removal process, the clamp plates have been separated by moving the upper clamp plate 18a, 18b vertically up and the lower clamp plate 20a, 20b vertically down. This separation can be seen best at the vent 16 and the mold inlet 14 where clamp plates 18b, 20b have moved away from the mold compound 34.

The upper and lower drive plates 26, 28, have also been moved vertically away from each other, and they have been moved by the same distance that the upper and lower clamp plates were moved. However, this motion of the drive plates away from the device 30 does not cause the cavity plates 22, 24 to open. The separation of the drive plates is exactly cancelled out by actively moving the drive plates horizontally to the right (in FIG. 5) so that the cavity plates 22, 24 are now deeper in the tapered cavity formed between the ramp surfaces 46, 48.

Moving the drive plates vertically apart with the clamp plates is typically done by mounting the upper and lower drive plates to the same external clamping mechanism as the upper and lower clamp plates. The drive plates are mounted to the external vertical clamping mechanism so that they can be moved horizontally, and a horizontal drive mechanism is provided to accomplish this motion, as needed to move the ramp surfaces 46, 48 relative to the clamp plates in the directions described above.

The net result of the simultaneous vertical outward motion of the drive plates with the horizontal motion is to keep the molded device clamped between the inner surfaces of the mold cavity 40, 42 until the entire perimeter of that device has been separated from the perimeter molding surfaces on the clamp plates.

This technique provides a significant advantage for the thin molded devices of the present invention as compared to prior removal techniques. With the technique described here, the molded device 30 is fully supported by the movable cavity plates 22, 24 during the critical stage when the mold is first opened. It is not uncommon for the molding compound to stick to the mold surface slightly as the mold is opened. By opening the perimeter first, the device is partially freed and the risk of damaging the molded device is significantly reduced.

After the perimeter is opened to the stage seen in FIG. 5, the remainder of the mold is opened by separating movable cavity plates 22, 24 to remove the molded device.

Figure 6:
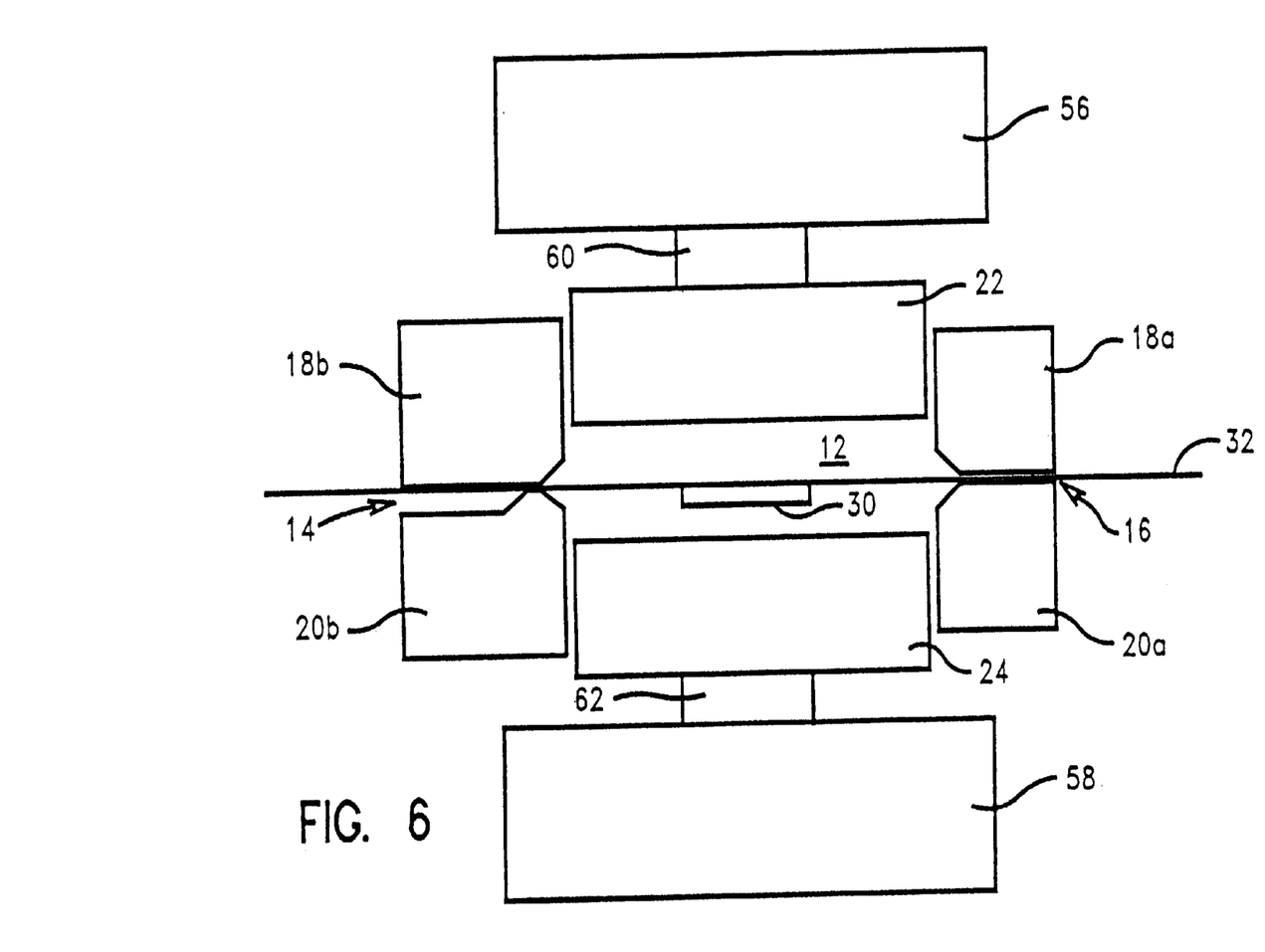
FIG. 6 is a side view, in cross-section, of an alternative embodiment of the mold of the invention.

FIG. 6 shows an alternative mold design in accordance with the present invention. In this embodiment, the cavity plates 22, 24 are opened and closed by vertical drivers 56, 58 operating drive rods 60, 62. The vertical drivers and drive rods may be any type of linear driver. Threaded rods driven by screw drivers and motors may be used, as may hydraulic piston/cylinder drivers or appropriately designed pneumatic piston/cylinder actuators.

Regardless of whether the design in FIGS. 1–5 or the design in FIG. 6 is used, the cavity plates 22, 24 need to be strongly supported. During the molding process, the cavity plates need to provide sufficient clamping force to resist the outward pressure from the injected molding compound. After the molding compound is injected, the cavity plate drivers need to provide sufficient closing force to close the mold and eject excess molding compound.

In both designs, the preferred method of opening the mold is to open the perimeter first, then open the cavity plates. The construction of the mold with the separate motion for the cavity plates permits this method of opening the mold in all cases.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of encapsulating a workpiece comprising the steps of:

providing a mold cavity in a mold, the mold cavity having a first volume and a pair of opposed mold surfaces, the pair of opposed mold surfaces being inner surfaces on a pair of opposed cavity plates, the cavity plates including corresponding inclined ramp outer surfaces;

positioning the workpiece in the mold cavity;

holding the mold between a pair of opposed drive plates, each drive plate having an inclined ramp inner surface, the inclined ramp inner surfaces on the opposed drive plates defining a tapered clamp cavity bearing against the inclined ramp outer surfaces on the opposed drive plates; adding mold compound to the mold cavity to encapsulate the workpiece;

reducing the volume of the mold cavity to a second volume less than the first volume by moving the mold into the tapered clamp cavity to reduce the distance between the opposed mold surfaces of the mold cavity; and curing the mold compound.

2. The method of encapsulating a workpiece according to claim 1 wherein the step of providing a mold cavity having a first volume comprises providing a mold cavity having a first volume of a size sufficiently large to permit laminar flow of the mold compound around substantially all sides of the workpiece during the step of adding mold compound to the mold cavity.

3. The method of encapsulating a workpiece according to claim 2 wherein the step of reducing the volume of the mold cavity to a second volume comprises reducing the volume of the mold cavity to a second volume having a size less than a size necessary to permit laminar flow of the mold compound around substantially all sides of the microelectronic device.

4. The method of encapsulating a workpiece according to claim 1 wherein the step of adding mold compound to the mold cavity, comprises adding liquid mold compound having properties which allow the mold compound to enter the mold cavity and substantially entirely surround the workpiece in laminar flow.

5. The method of encapsulating a workpiece according to claim 1 wherein the step of adding mold compound to the mold cavity, comprises adding a volume of mold compound greater than the second volume of the mold cavity, and wherein the step of reducing the volume of the mold cavity to the second volume includes squeezing out an excess of mold compound from the mold cavity.

6. The method of encapsulating a workpiece according to claim 1 wherein the step of reducing the volume of the mold cavity to a second volume comprises reducing the distance from the opposed mold surfaces of the mold cavity to the workpiece to less than about 250 micrometers.

7. The method of encapsulating a workpiece according to claim 1 wherein the pair of opposed mold surfaces in the mold cavity are located at defined distances from the workpiece to equalize flow fronts of the mold compound on opposite sides of the workpiece during the step of adding mold compound to the mold cavity.

8. The method of encapsulating a workpiece according to claim 1 further including the step of opening the mold in two stages, the first stage including opening a perimeter of the mold, and the second stage comprising opening the cavity plates.

9. The method of encapsulating a workpiece according to claim 8 wherein during the first stage of opening the perimeter of the mold the drive plates are simultaneously moved apart and driven to reposition the cavity plates deeper in the tapered clamp cavity, said movement apart and repositioning canceling outward motion of the cavity plates so that the cavity plates are not separated during the first stage.

10. The method of encapsulating a workpiece according to claim 1 wherein the step of reducing the volume of the mold cavity comprises driving the opposed cavity plates towards each other with linear drivers.

11. The method of encapsulating a workpiece according to claim 10 wherein the linear drivers are screw thread drivers or hydraulic drivers.

12. The method of encapsulating a workpiece according to claim 1 wherein:

the mold cavity includes an inlet and a vent; and the step of adding mold compound to the mold cavity comprises adding mold compound through the inlet, the first volume of the mold cavity being shaped, and the inlet and vent being positioned relative to the workpiece in the mold cavity, to substantially fill the mold cavity with mold compound before the mold compound reaches the vent.

13. The method of encapsulating a workpiece according to claim 1 wherein the step of adding mold compound to the mold cavity comprises:

providing a measured amount of a non-liquid mold compound;

heating the mold compound to liquefy the mold compound; and pressurizing the mold compound to inject it through the inlet into the mold cavity.

14. The method of encapsulating a workpiece according to claim 1 wherein the mold compound is a thermosetting plastic.

15. The method of encapsulating a workpiece according to claim 1 wherein the mold compound includes a filler.

16. The method of encapsulating a workpiece according to claim 15 wherein the filler is silica.

17. The method of encapsulating a workpiece according to claim 1 further including the step of opening the mold in two stages, the first stage including opening a perimeter of the mold, and the second stage comprising opening the remainder of the mold.

18. The method of encapsulating a workpiece according to claim 1 wherein the workpiece is an electronic workpiece.

19. The method of encapsulating a workpiece according to claim 18 wherein the workpiece is a microelectronic device.

* * * * *